United States Patent [19]
Blonder et al.

[11] Patent Number: 5,158,908
[45] Date of Patent: Oct. 27, 1992

[54] DISTRIBUTED BRAGG REFLECTORS AND DEVICES INCORPORATING SAME

[75] Inventors: Greg E. Blonder, Summit; Edwin A. Chandross, Berkeley Heights; Seng-Tiong Ho, Murray Hill; Samuel L. McCall, Chatham; Richart E. Slusher, Lebanon; Kenneth W. West, Mendham, all of N.J.

[73] Assignee: AT&T Bell Laboratories, Murray Hill, N.J.

[21] Appl. No.: 590,197

[22] Filed: Sep. 28, 1990

Related U.S. Application Data

[63] Continuation-in-part of Ser. No. 575,930, Aug. 31, 1990, abandoned.

[51] Int. Cl.⁵ .............................................. H01L 21/20
[52] U.S. Cl. .................................... 437/129; 437/130; 437/133; 148/DIG. 50; 148/DIG. 95
[58] Field of Search ....................... 437/129, 130, 133; 148/DIG. 95, DIG. 50; 372/96

[56] References Cited

U.S. PATENT DOCUMENTS

| | | | |
|---|---|---|---|
| 3,983,509 | 9/1976 | Scifres | 372/96 |
| 4,764,246 | 8/1988 | Bridges et al. | 437/129 |
| 4,873,696 | 10/1989 | Coldren et al. | 372/96 |

FOREIGN PATENT DOCUMENTS 78232 3/1990 Japan ................................ 437/133

OTHER PUBLICATIONS

U. Koren, et al. "InGaAsP/InP undercut mesa laser with planer polyimide passivation" Appl. Phys. Lett 42(5) pp. 403-405 (1983).

Primary Examiner—Brian E. Hearn
Assistant Examiner—Linda J. Fleck
Attorney, Agent, or Firm—George S. Indig

[57] ABSTRACT

Distributed Bragg Reflectors of high efficacy based on alternating layers of large difference in refractive index are fabricated by epitaxial growth followed by etchant removal and back-filling to produce a structure in which alternation is between layers of retained epitaxially grown material and layers of back-filled material. Such reflectors may serve simply as mirrors or may be incorporated in a variety of devices including lasers, LEDs, detectors, optical switches in which the DBRs serve e.g. for cavitation.

13 Claims, 2 Drawing Sheets

DISTRIBUTED BRAGG REFLECTORS AND DEVICES INCORPORATING SAME

Cross-Reference to Related Application

This is a continuation-in-part of co-pending application Ser. No. 575,930, filed Aug. 31, 1990, now abandoned

BACKGROUND OF THE INVENTION

1. Field of the Invention

The invention is concerned with devices entailing the reflection of electromagnetic radiation—specifically in which the reflection is by a principle sometimes referred to as Distributed Bragg Reflection. Reflectors of this nature serve a variety of uses and all are of consequence to the invention. Uses include simple reflection in which the device contemplated may be the reflector itself as well as more sophisticated devices, e.g. including cavities, in which cavitation, of coherent or incoherent light is at least in part attributed to Distributed Bragg Reflection.

2. Description of the Prior Art

Distributed Bragg Reflectors (DBR) are of increasing significance due largely to their capability of more completely reflecting energy. This advantage is retained for essentially the entire spectrum of electromagnetic energy although specific design is for a specific fractional spectrum. Whereas simple or single interface reflectors continue to serve their many purposes, effectiveness is wavelength-dependent. For many uses resort must be had to DBR e.g. as in the x-ray spectrum. At other wavelengths, so-called "effective reflection" of perhaps as great as 95% or even 98+% is inadequate or at least awkward. Laser cavities designed both for effective emission and e.g. to take heat dissipation into account, may take advantage of 99+% cavity reflection—a value not generally realizable for simple reflection.

DBR design and fabrication is dependent upon a number of considerations—some economic, some functional. Depending as they do upon accumulated reflection resulting from successive contributions at interfaces between successive pairs of material of differing refractive index, operation is dependent upon the refection/transmission ratio at concerned interfaces—a characteristic determined by $\Delta n$ (the difference of refractive index of the two materials forming the interface). This value, in turn, determines the number of layers required for a given reflectivity. Increasing $\Delta n$ has economic implications in permitting a smaller number of layers, has yield implications in that fabrication simplification (attendant e.g. on need to deposit lesser number of layers) statistically lessens flaws, and has operational implications e.g. in that reflection traversal path may be shortened, thereby improving response time.

Most demanding DBR structures, for example, those used in laser cavitation, depend upon a very high degree of crystalline perfection. This need is satisfied by a variety of epitaxial growth techniques. Procedures finding acceptance in laser fabrication at this time include Molecular Beam Epitaxy, Chemical Vapor Deposition and variants. All such procedures as applied, for example, to growth of layers of permitted thickness variation corresponding with a monolayer as referenced to nominal layer dimensions of hundreds of Å, are extremely time consuming and expensive. Vertical Cavity Surface Emitting Laser (VCSEL) cavities, commonly requiring very high reflectance efficiency, may entail several hours of deposition processing in expensive, high space consuming equipment. Some have estimated that such processing represents 50% or more of device cost.

Operationally, DBR complexity has consequences of significance. Dependence upon many-layered reflectivity statistically increases interfacial defects, dimensional inhomogeneity—e.g., layer thickness variation, as well as increasing cavity path length. It is to be expected that all such considerations are favorably affected by decreasing the number of Bragg layers. Since this design criterion—the number of layers required for a desired value of reflectivity—varies with the ratio of indices of refraction at the interface, every effort is made to seek out materials of largest $\Delta n$ in otherwise satisfactory materials (e.g., materials of desired atomic dimension, morphology, crystalline orientation).

While the search for still more effective materials continues, the need is less for certain wavelength regimes. For example, available $\Delta n$ values for 99.7% cavity reflectivity at wavelengths $\lambda = 0.85$–$0.98$ $\mu$m is sufficient to realize laser cavitation for a single quantum well GaAs-based VCSEL using DBR mirrors of $\approx 18$ pairs of GaAs/AlAs ($\Delta n = \approx 0.65$). Cavitation for other wavelengths is not so easily attained. For example, InP-based materials used in laser cavitation at $\approx 1.55$ $\mu$m have not offered such $\Delta n$ values. A single quantum well VCSEL for operation at this wavelength has not yet been publicity demonstrated and would likely require as many as 40 Bragg pairs for each mirror ($\Delta n = \approx 0.3$).

DBR cavities, essential to the operation of (coherent) laser devices described, serve a secondary function which may be of value for incoherent emission—e.g., in providing directionally with implicit advantage in terms of brightness for efficiency (brightness of the desired field of view). In general, cavitation of such incoherent sources has been impeded by unavailability of mirrors accommodating the spectral emission range which is quite broad relative to that of a laser. This impediment would be alleviated by large values of $\Delta n$. (Wavelength dependence of reflectivity decreases as $\Delta n$ increases.) A number of other uses will be well served by $\Delta n$ values greater than those presently available. Such uses include wavelength sensitive detectors, optical logic etalons, optical modulators, as well as systems and processes requiring high reflectivity mirror elements. The latter category includes various types of projection, and, at this time, may be of consequence in projection lithography e.g. for fabrication of devices of submicron dimensions.

SUMMARY OF THE INVENTION

The invention depends upon increased $\Delta n$ values realized by etch-removal followed by back-filling of alternating layers of DBR structures. It is of particular consequence for use in sophisticated devices/systems in which functionality is dependent upon the high degree of perfection ordinarily attained only by use of carefully conducted MBE, CVD and related processes. In accordance with the invention, layers—either those of higher refractive index or those of lower refractive index—are selectively removed by etching, followed by replacement by material of respectively still higher or still lower index.

In accordance with the inventive teaching, the excellent functional properties of epitaxial Bragg structures are largely retained first by etching with a highly composition-dependent etchant, and by replacement of etch-removed layered material by material of appropriate refractive index. Back-filling, specific details of which may vary as described herein, generally entails use (partial or total) of organic polymeric material having appropriate physical properties both for fabrication and operation. The former generally requires a low initial level of viscosity, a low level of unwanted reactivity-properties required to assure generally voidless, uncontaminated back-filling. The latter generally requires requisite optical properties—e.g. appropriately low radiation absorption, temperature stability, and stability with respect to other contemplated influences.

Satisfaction of the above is of value in the whole variety of uses already served by DBR, as well as, some which have been effectively precluded by adverse characteristics now overcome. Lasers operating at already expedient wavelengths are served by devices in accordance with the invention which may depend on a lesser number of Bragg layers—with beneficial implications in terms of e.g. fabrication economy, as well as, response time. As noted, certain types of structures, e.g. 1.55 $\mu$m VCSELs have been largely unattainable—a circumstance now remedied by use of the inventive teaching.

High $\Delta$n values in reducing the degree of reflectivity dependence on wavelength is expected to serve in a broad category of uses. Generation, as well as, detection of incoherent electromagnetic radiation will be of consequence, for example, in high directionality, high brightness efficiency LED-containing cavities. Implications in terms of radiation-promoted reactions, as in reproduction and facsimile may be considerable, may result in replacement of lasers as well as other presently used light sources.

DETAILED DESCRIPTION

Drawing

Figure 1A:
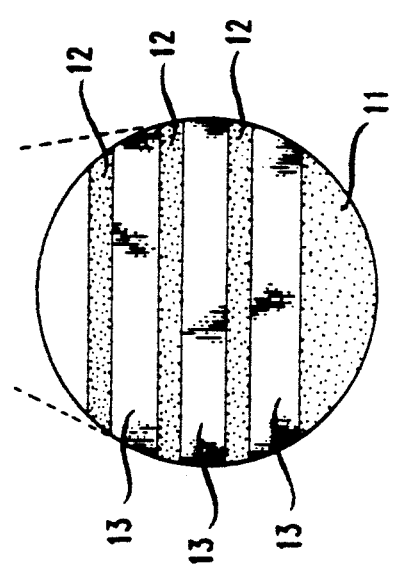
FIG. 1 and 1A are a schematic perspective view depicting a device including a DBR structure in accordance with the invention.
Figure 1:
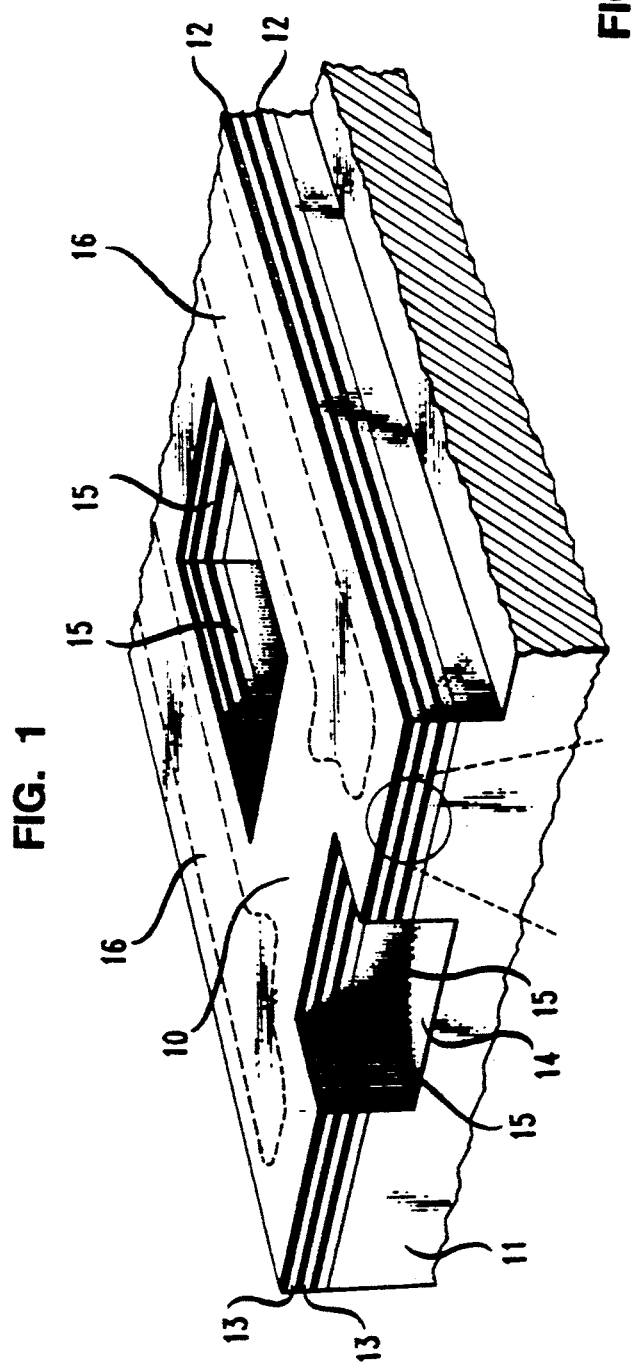

The device of FIG. 1 includes a DBR 10 atop substrate 11. Initial fabrication involves epitaxial growth of layers 12—generally of material having the larger value of refractive index—embracing layers 13. In fabrication layers 13 were produced by also epitaxial growth of dispensable material which was subsequently etch removed and replaced by organic composition-containing material in accordance with the invention. For the usual structure in which layers 12 are of the higher index material, layers 13 as back-filled are of the lower. (Since the now-removed material initially constituting layers 13 plays no functional role in operation, there is no requirement regarding index of refraction-it may be selected solely on the basis of fabrication expediency.) The structure of FIG. 1, as constituted of paired materials GaAs and acrylic polymer, serves as a 99+% efficient reflector for 0.98 $\mu$m radiation. (This compares with reflectivities of $\approx$65% for the commonly used pairs of GaAs/AlAs.) In terms of 1.55 $\mu$m radiation, such a structure utilizing e.g. acrylic back-filled InP may yield reflectivity of approximately the same value. (Unmodified InP—based DBR structures—paired layers of InP/InGaAsP—yield only $\approx$50% reflectivity.)

This figure is used in discussion of device fabrication further on. Briefly, etch removal of layers 13 is accomplished by edge exposure during immersion within etchant not shown. Expedient removal is expedited by provision of apertures 14 baring edge surfaces 15.

For a particular embodiment, etchant composition/conditions were such as to prevent removal of material in layers 13 within regions 16 so as provide structural support, assuring continued separation of layers 12 during processing and thereafter.

Figure 2:
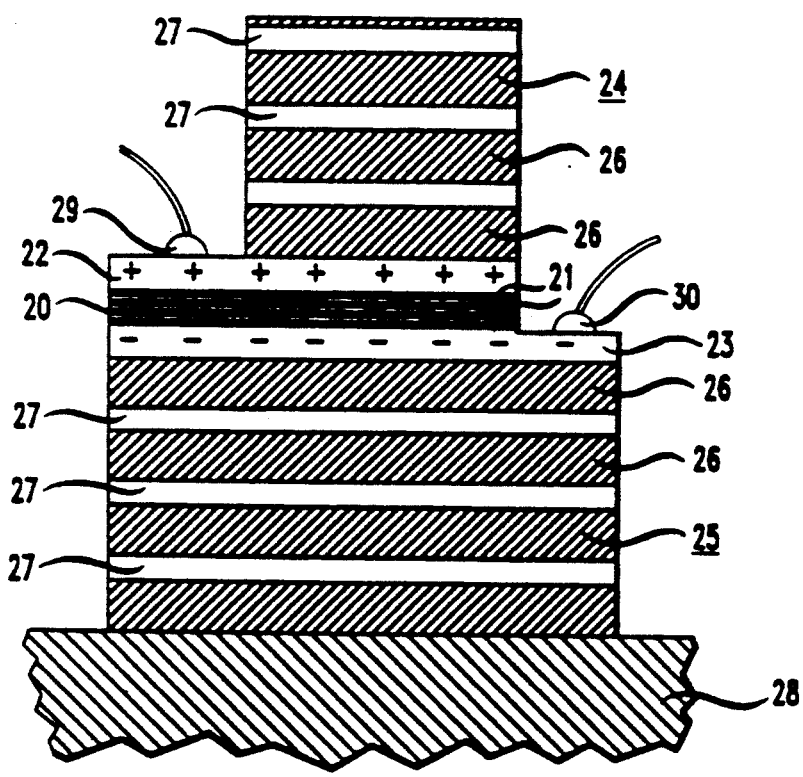
FIG. 2 is a schematic elevational view of a cavity structure containing an active region straddled by two DBRs.

FIG. 2 is representative of a category of devices of the invention in which DBR mirrors serve to cavitate electromagnetic energy, either coherent or incoherent, as yielded by an embraced active region. In this figure, the active region 20 is shown as consisting of four quantum wells 21 which together are representative of a recombination region which is in turn embraced by p-type semiconductor layer 22 and n-type semiconductor layer 23. Design requirements are well-known and are not discussed in detail. As in all such structures, optimal performance requires that the recombination region encompass an antinode for wave energy of concern in a cavity with resonance at the desired wavelength. The functional structure is completed by DBRs 24 and 25, each of which is constituted of back-fill layers 26 and retained epitaxially grown layers 27. Substrate 28, upon which the original unetched structure was grown, is shown in broken section. Electrodes 29 and 30, making electrical contact to layers 22 and 23, respectively, serve for the usual contemplated operation in which the structure is electrically pumped.

It has been indicated that an important aspect of the invention concerns incoherent rather tran coherent cavitation. The large $\Delta$n values realizable give rise to facility which translates into effective means for imparting direction, and, therefore, improved image field brightness for a far broader spectrum than characterizes a laser. A major advantage realized by substitution of e.g. an LED for the lasing active region is concerned with fabrication cost. Requirements for expected uses such as in photocatalysis and perhaps more importantly in the growing field now served by laser surgery, are satisfied by attainment of desired energy level with little or no regard to spectral width and coherence. There are instances where the device category represented by use of an LED is in fact advantageous. An example is in avoidance of the speckle sometimes characteristic of laser imaging.

Treating FIG. 2 as a cavity structure based on an LED active region 21, relieves some of the structural demands. An LED active region 21 like a bulk rather than quantum well laser, does not necessarily contain the quantum wells depicted. Dimensional considerations, while not of the same necessary precision, are similar. For the instance in which the embraced active region 20 is of lower refractive index than the adjoining mirror layers, the thickness dimension (the dimension corresponding with the emission direction) is one or more wavelengths—for the LED case desirably approximates one or more wavelengths for the central frequency emitted. Again, reliance is had on the well-known design criteria for such structures which dictate a different dimension in the instance in which embracing mirror layers are of lower index than the active region.

The numbers, as well as precision of DBR layers shown, may be relaxed for the incoherent device. The structure depicted as optionally including four quantum wells is in fact capable of lasing at e.g. 0.95 μm for the Bragg structures shown (use of acrylic back-filling with retained epitaxially GaAs layers) result in a Δn value ≦2.05.

Device Categories

All devices of the invention entail distributed reflectivity of a type ordinarily associated with Distributed Bragg Reflectors. As usually contemplated, DBR structures consist of at least three functional interfaces (by "functional" is meant interfaces contributing to the cumulative reflection of the device)). In making this statement, it is recognized that there is some disagreement, at least with certain types of DBRs, as to whether reflectivity should be ascribed simply to two-dimensional interfaces, or whether some degree of penetration might be entailed. There are even structures that for various reasons, including ease of fabrication, deliberately utilize perturbations of more gradual slope then that of the precipitous interface ordinarily contemplated at least in text books. The terminology, DBR, as used herein, is intended to include any of the above.

The inventive teaching is based on replacement of one or more layers of epitaxially grown material to produce large values of Δn. The simplest structure entails replacement of at least one such layer. For many contemplated purposes, DBRs are expected to yield reflectance values of 99+%. Attainable Δn values in accordance with the invention, while certainly wavelength dependent, commonly range at 1 and above. In terms of the usual desire for 99+% reflectance as in VCSEL structures, this translates into three or more pair DBRs, and such DBRs represent a preferred aspect of the invention. VCSELs represent an area of intense activity at this time. Structural variations are many—include devices using but a single quantum well, use of hybrid mirrors (DBRs of reduced layer count as supplemented by conventional reflecting members), encircling electrodes with hourglass current path configuration assuring current confluence in the active region, etc. etc. Here, as elsewhere, no attempt is made to describe the vast variety of devices/device variations which may profit by use of the inventive DBRs. Even here, other uses, such as cavity-containing LEDs, in owing their value to fabrication economy, may be well served by one or two such pairs in each DBR.

Structures gaining by the inventive teaching—to some extent dependent upon availability of highly selective etchant compositions/processes—are accordingly described as including high aspect ratio layers. For these purposes, all such structures are based on at least one back-filled layer having a width or length to thickness ratio of at least 3:1. Processes conducted in accordance with the inventive teaching have resulted in successful back-filling of layers having such aspect ratios of 6:1 and higher. Such ratios characterize usual DBR structures particularly as serving in VCSEL cavities and are preferred in accordance with the invention. At this time there is little reason to consider anything other than uniformity of index within any given epitaxially produced layer (either as retained or replaced), nor any deliberate variation in Δn for the usual multi-layered structures. The inventive teaching, however, is applicable to attain any such variation so that, for example, back-filled material may be deliberately varied in index in any direction to accommodate any needs and retained and/or back-filled epitaxially produced layers may vary in index. By the same token, initial use will likely be in construction of DBR structures of alternating layers with every other layer replaced. Structural device requirements may benefit by variations such as etch removal and back-filling e.g. of every third layer. In general, alternating layers as grown—layers to be replaced—are of material chosen with a view to fabrication—index of such removed layer plays no role in ultimate device operation. Device design may contemplate retention of one or more of such layers in which event material choice might satisfy optical needs (in lieu of optimization simply in terms of epitaxy and ease of removal).

The Process

It is convenient to discuss other aspects of the invention in terms of processing. In this section discussion is largely directed to fabrication which differs because of the inventive teaching—to fabrication largely as concerning removal and back-filling to attain the inventive objectives.

In every instance, fabrication entails epitaxial growth on a "substrate"—on a surface evidencing the degree of perfection, lattice parameters, etc. required for epitaxial growth of material of requisite quality. Ordinarily, the functioning portion of the mirror is best served by imperfection-free material which is uniform at least in the layer direction (ordinarily in thickness direction as well).

Epitaxial growth may take any of the various forms appropriate to device/composition. Experimental work on which reported results are based made use of MBE, CVD, or variants. Workers in the field are aware of the various procedures and their limitations and may choose other types of epitaxial growth. Liquid Phase Epitaxy is an example. Expediency in attainment of perfect or near-perfect epitaxy is advanced by non-retention, generally of alternating grown layers. As indicated, such material, in many instances, may be chosen to advance this objective without regard to device function (since it is to be removed).

In a very real sense the value of the inventive teaching is based on separation of fabrication conditions from ultimate device operation. As indicated, outstanding performance of Distributed Bragg Reflectors has been a consequence of extremely precise control in terms of freedom from imperfection as well as interfacial smoothness. Such structures depend upon ¼ λ mirror layers of material of alternating refractive index with sufficient freedom from crystalline imperfection and surface roughness to allow near-theoretical ray behavior. Unfortunately, this accomplishment has imposed sufficiently severe requirements as to limit device functioning—as to limit device functioning particularly in terms of limited Δn values, in turn: requiring large numbers of mirror pairs; imposing limitations on wavelength as well as spectral width of radiation to be reflected; introducing absorption loss of particular consequence at shorter wavelengths, e.g., in the X-ray spectrum.

Virtually complete separation of the two considerations permits removal and replacement of alternating layers so as to produce higher Δn values while, in large part, retaining the freedom from structural imperfections noted. A preferred embodiment of the invention may further enhance surface smoothness of etch-revealed surfaces—to result ultimately in greater layer-to-layer smoothness. Such interfacial smoothness is largely a consequence of growth, rather than etch removal. Surface smoothness of a growing layer is dictated by energy considerations. Ultimate smoothness, to the extent permitted by the atomic arrangement of the material, corresponds with the lowest free-energy state of the surface. Accordingly, assuming reasonably uniform growth conditions, attainment of ultimate smoothness is a matter of kinetics. An important factor of consequence in determining smoothness concerns kinetics of the movement of material as deposited. Depending on the deposition process used, such material may correspond with a final device-functioning material, e.g. AlAs, or alternatively, with initial component/s or other precursor, e.g. the atom Al. Reference to mobility in terms of final device composition should be considered as entailing either possibility. It turns out that certain materials are of lesser mobility, to result in a tendency for depositing material to remain where initially deposited. Particular materials, advantageously used in the invention—chosen on the basis of etch-selectivity—are of low mobility under conditions designed for ease of fabrication, e.g., for high throughput. Specifically, AlAs (or more precisely, for the MBE deposition process used, the atom, Al) has a very much lower mobility than that of the companion material GaAs. Under growth conditions otherwise desirable, etch removal of growth of AlAs of required layer thickness (of one or some greater odd multiple of $\frac{1}{4} \lambda$) may result in surface roughness which is transferred to the subsequently epitaxially-grown GaAs to be retained. Removal of the AlAs followed by backfilling produces interfacial roughness which may be of device consequence.

Several remedies for this interfacial roughness are offered. Since the problem is simply kinetic, rather than thermodynamic, temperature may be increased, time may be increased, etc. To the extent that material of alternating layers is unaffected—to the extent that other device properties are not impaired—this may be an adequate solution. An example herein takes a different approach. In Example 2 the disposable "layer" is in fact made up of two, or a multiplicity of sublayers. In accordance with the work reported in this example, the final sublayer was of one or a small number of monolayer thicknesses of AlAs. Limited mobility of this near-monolayer, in consequence, could have only minimal adverse affect in terms of surface roughness. The underlying surface of high-mobility assured GaAs together with this consideration resulted in the improved smoothness.

While the genus of this preferred embodiment is so described, the particular work reported in Example 2 is representative of an important approach. Maximum utilization of the increased mobility associated with the Ga-containing composition was realized without impairing etch-removability by use of sufficiently thin alternating layers (of GaAs, AlAs) so as to be "seen" by the etchant virtually as a homogeneous alloy composition. Growth of near-monolayer thick layers minimized the smoothing required of the higher mobility GaAs—reduced the depth of crevices of underlying AlAs to be filled.

Other work, resulting in improved interfacial smoothness, depended upon use of a uniform alloy composition—e.g., 0.6 AlAs. 0.4 GaAs. Again, increased mobility of the now-uniform composition resulted in smoothness substantially improved relative to that attained by the binary AlAs alone. Again, etch selectivity was not seriously impaired.

Prototype DBRs are ordinarily based on grown layer thickness, each of a quarter wavelength. Back-filling expediency, where selectivity is restricted or where particular device characteristics are sought, may impose limitaitons on minimum thickness. For example, necessary use of relatively high viscosity material may impose requirement for e.g. three, five, or more quarter wavelength thickness—perhaps by reason of temperature limitations in fabrication; perhaps due to fabrication or functional need to use relatively high molecular weight material (other than the usual compositions which afford both low viscosity in fabrication, as well as, high molecular weight attributes in the final device).

The preceding paragraph is based on fundamental considerations. Direct applicability to reflector design using real materials is generally appropriate. However, under certain circumstances, e.g. when absorption loss is particularly high as it is for the x-ray spectrum, optimization may suggest deviation. For example, where one of the two paired Bragg layers is significantly more absorptive than the other, net enhancement may result from pairs constituted of thinner high absorption and thicker low absorption layers (still totalling $\frac{1}{2} \lambda$).

To a certain extent the invention depends on the observed ability for selective etch removal of high aspect ratio layers. This objective, as noted, is advanced by the freedom to choose e.g. alternating layers without regard to device function-perhaps with regard to etch removal, of course, with other compatible fabrication needs. An example herein makes use of hydrofluoric acid and this material showed adequate selectivity as between AlAs to be removed and e.g. GaAs. As is known, etching conditions are of consequence as well. In one instance, reduced temperature ($\approx 0^\circ$ C.) produced surfaces of increased smoothness. In another, ultrasonic vibration resulted in more effective selective removal. The flexibility with which disposable material may be chosen permits processing on the basis of the many known etch dependent factors.

Liquid etchants are generally available to satisfy fabrication needs and are otherwise conveniently used. Uniform penetration is assured by simple control measures—maintenance of temperature uniformity, agitation, etchant concentration uniformity, etc.—all easily controlled while using simple immersion etching. Vapor state etching imposes some greater demands on apparatus and control but may serve. Controlled area etching, e.g. by use of masked reactive ion etching may be used—may be of particular value where materials are such that etch removal selectivity is limited. The latter could even be used to create voids to be back-filled within gross bodies of unvarying composition.

In most fabrication it is critically important that there be no residue on relevant surfaces during back-filling. In some instances etchant removal is easily accomplished e.g. by evaporation. In most circumstances, however, imposition of fabrication requirements restricts choice of etchants so that removal requires special precaution—often one or more specific removal steps. In general, removal is accomplished by use of solvent material serving this sole purpose. In the instance of liquid state HF etching, dilution with water to terminate etching resulted also in partial removal. Freedom from etchant-/dissolved material, as well as from unwanted by-products, was assured by continual dilution, sometimes as accompanied by ultrasonic agitation, followed ultimately by acetone removal of water. Experimentally, it was found that collapse of retained layers resulted during dilution. Collapse was avoided by limiting the degree of dilution. It was assumed that collapse was the result of capacitive charging of the retained layers (as enhanced due to good dielectric quality of highly diluted acid solution) due to stray electrical fields. Retention of acetone on the surfaces aided in avoidance of voids during back-filling.

A consideration of some consequence is avoidance of collapse of retained layers—of particular concern for larger aspect ratios. While collapse may be alleviated in a number of ways, for example, by the retained material within regions 16 in accordance with the embodiment of FIG. 1, it may be desirable to take other precautions. It has been found useful to keep etch voids (corresponding with removed layers) filled with liquid to be displaced during back-filling. Simple retention of acetone in the above procedure has been effective. In certain instances, it is necessary to present dried, unfilled regions for back-filling. An example concerns use of relatively high viscosity material (required perhaps by reason of functional characteristics) which may not readily displace filling material. A solution involves use of $CO_2$—in one experiment, above the critical point ($\approx 1100$ psi, and 31.5° C.). Specifically, the procedure, known as supercritical drying (see, A. Boyde and P. Vesely, "1972 Proceedings of the Annual Scanning Election Microscopy Symposia", p. 266) involved the introduction of gaseous $CO_2$ under conditions such that it was liquified to dissolve and remove remaining acetone. Heating to a temperature above the critical point followed by removal of gas state $CO_2$ completed the process.

Back-filling materials are chosen with regard to ease of fabrication, as well as, device functioning. Since the overall objective is large $\Delta n$, it invariably has a refractive index which differs significantly from that of adjoining retained material. From the fabrication standpoint, a primary requirement is low viscosity—to expedite introduction without leaving interfacial voids——and, as noted, in some instances to displace retained filling material.

Most success has been had with thermosetting resins, noted for their dimensional stability, cured after filling so as to take advantage of low viscosities of low molecular weight starting ingredients. Exemplary materials are the amine-cured epoxies, organosiloxane polymers (e.g. "Glas Resins ®" supplied by OINEG) and acrylics (such as "LR White" (soft grade)—(see, G. R. Newman, et al., "J. Microscopy", vol. 127, RP5-RP6 (1982).

The uncured resin components may be introduced as a solution in a low viscosity organic solvent (e.g., acetone) to facilitate penetration of the etched layered structure, followed successively by more concentrated solutions to provide a greater density of resin in the final structure. Alternatively, low viscosity may be achieved by the well known technique of using a low viscosity, reactive diluent that is incorporated into the final resin (which may be either thermoplastic or thermosetting). After filling, the resin components may be cured by conventional means, e.g., by thermal or photochemical activation of suitably chosen components in the mixture of monomers and/or prepolymers and curing agent(s).

EXAMPLE 1

The configuration of FIG. 1 is produced by epitaxial growth on a substrate of GaAs of overall dimensions approximately 0.5"×1.0"×0.02" of successive layers (layers denoted 12, 13 on the FIG.) of 1341 Å thick AlAs, 2,960 Å thick (5 $\lambda/4$ layer) $Al_{0.3}Ga_{0.7}As$ to result in the six layer structure depicted. AlAs layers are etch removed by aqueous 10 wt. % HF 0° C. under ultrasonic agitation.

Removal of layered material of maximum dimension of 30 $\mu m$ requires approximately three minutes in the 10% acid solution. Following, the hydrogen fluoride solution is diluted with distilled water to $\approx 1$ part HF in 10,000. Removal of the essentially pure water residuum is by acetone.

Mutual solubility of residual acetone and acrylic back-filling material eases introduction (any possible small amount of dissolved acetone is of immeasurable effect in the functioning device). Etch removal and back-filling are expedited by provision of rectalinear voids as shown in the figure. The procedure entails conventional masking followed by use of a non-preferential etchant.

$\Delta n$ values of approximately 1.91 for $\lambda = 0.88$ $\mu m$ results in reflectivity exceeding 97%.

EXAMPLE 2

The configuration of FIG. 1 is produced in accordance with a process variation in which the disposable "layer" is in fact constituted of a succession of very thin layers again of alternating composition (here referred to as a "superalloy").

Growth is epitaxial on a GaAs substrate. Layers as grown in succession on the substrate are: 6 Å units thick AlAs—4 Å units thick GaAs, etc. for totality of $\approx 145$ pairs (total thickness of 1,450 Å units). A 2,966 Å units thick layer of $Al_{0.3} Ga_{0.7} As$ is grown atop the superlattice layer. The procedure is repeated five times to result in a totality of six superalloy layers and six $Al_{0.3} Ga_{0.7}$ As layers of the thicknesses set forth. Superalloy layers are etch removed with HF of concentrations and under conditions as set forth in Example 1.

We claim:

1. Process for fabrication of a device comprising a Distributed Bragg Reflector comprising a plurality of layers of high and low refractive index material with regard to electromagnetic energy of a wavelength intended for use in device operation, in which one such refractive index material is grown epitaxially CHARACTERIZED in that the other such refractive index material is produced by back-filling of etch-removed epitaxially grown disposable material, thereby resulting in a Distributed Bragg Reflector in which the said plurality of layers includes at least one retained layer of high or low refractive index in contact with at least one back-filled layer of refractive index which differs significantly from the said-retained layer, to result in an index difference, $\Delta n$, numerically at least equal to 1 as between said retained layer and said back-filled layer.

2. Process of claim 1 in which etch-removed epitaxially grown disposable material is of composition differing from that of the said at least one retained layer.

3. Process of claim 2 in which etch removal is by use of etchant which selectively removes said disposable material.

4. Process of claim 3 in which said reflector consists essentially of alternating layers of said high and low refractive index material.

5. Process of claims 3 or 4 in which each layer of epitaxially grown disposable material consists essentially of a plurality of uniformly thin sub-layers of differing compositions, one such sub-layer composition being substantially more soluble in etchant as used for selective removal in accordance with claim 3.

6. Process of claim 1 in which back-filling is by precursor materials yielding back-filling consisting essentially of thermoset polymeric material upon curing subsequent to back-filling.

7. Process of claim 1 in which etch-removal is followed by at least one step in which etchant is removed.

8. Process of claim 7 in which etchant removal entails introduction of material which dissolves such etchant.

9. Process of claim 8 in which the etchant is a water solution and in which etchant removal comprises further dilution of the said etchant.

10. Process of claim 9 in which such further dilution is succeeded by introduction of an organic solvent material compatible with the said back-filling material.

11. Process of claim 7 in which etchant removal is succeeded by supercritical drying.

12. Process of claim 11 in which supercritical drying consists essentially of introduction of carbon dioxide at pressure and temperature above its critical point and in which supercritical drying follows directly after etchant removal.

13. Process of claim 1 in which $\Delta n$ is numerically at least equal to 1.8, in which retained refractive index material comprises AlGaAs.

* * * * *